(12) United States Patent
Lin

(10) Patent No.: US 10,264,694 B1
(45) Date of Patent: Apr. 16, 2019

(54) FASTENING DEVICE FOR STACKING EXPANSION CARDS

(71) Applicant: Super Micro Computer Inc., San Jose, CA (US)

(72) Inventor: Te-Chang Lin, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/984,412

(22) Filed: May 20, 2018

(51) Int. Cl.
| H05K 7/14 | (2006.01) |
|---|---|
| H05K 1/14 | (2006.01) |
| H01R 12/70 | (2011.01) |
| H05K 1/11 | (2006.01) |

(52) U.S. Cl.
CPC ....... *H05K 7/1417* (2013.01); *H01R 12/7011* (2013.01); *H01R 12/7076* (2013.01); *H05K 1/144* (2013.01); *H05K 1/117* (2013.01); *H05K 2201/041* (2013.01); *H05K 2201/09063* (2013.01); *H05K 2201/1031* (2013.01); *H05K 2201/10265* (2013.01); *H05K 2201/10333* (2013.01); *H05K 2201/10393* (2013.01)

(58) Field of Classification Search
None
See application file for complete search history.

(56) References Cited

U.S. PATENT DOCUMENTS

| 8,085,552 | B2 * | 12/2011 | Takao | G06F 1/185 |
| | | | | 361/807 |
| 9,468,123 | B2 * | 10/2016 | Yu | H05K 7/142 |
| 10,101,523 | B1 * | 10/2018 | Lai | H05K 1/0201 |
| 2010/0033942 | A1 * | 2/2010 | Yang | H05K 7/1417 |
| | | | | 361/809 |
| 2010/0195304 | A1 * | 8/2010 | Takao | G06F 1/1616 |
| | | | | 361/804 |
| 2011/0249419 | A1 * | 10/2011 | Sun | H01R 12/7011 |
| | | | | 361/803 |
| 2016/0268713 | A1 * | 9/2016 | Norton | G06F 13/4068 |

\* cited by examiner

*Primary Examiner* — Dimary S Lopez Cruz
(74) *Attorney, Agent, or Firm* — Chun-Ming Shih; HDLS IPR Services

(57) ABSTRACT

A fastening device for stacking expansion cards includes a fastener, a clamping member and a connection band. The fastener includes a body, the body includes a top portion and a bottom portion opposite to each other. A fastening hole is formed on the top portion along an axial direction. Multiple claws are extended from the bottom portion. The clamping member includes a clamping base, a pin, a resilient element, and a push plate driven by the resilient element to move on the clamping base. One end of the pin protrudes from the clamping base to be inserted into the fastening hole. The connection band is bendable. One end of the connection band is connected to the fastener, and the other end of the connection band is connected to the clamping member. The fastening device can fasten stacked expansion cards to a circuit board.

10 Claims, 6 Drawing Sheets

FASTENING DEVICE FOR STACKING EXPANSION CARDS

TECHNICAL FIELD

The present invention relates to a fastening device for an expansion card and, in particular, to a fastening device for stacking expansion cards.

BACKGROUND

Expansion cards are installed on a computer motherboard to add functionality of a computer system, such as Wi-Fi, bluetooth, the global positioning system (GPS), the near-field communication (NFC), the digital radio, the wireless gigabit alliance (WiGig), the wireless wide area network (WWAN), and a solid state drive (SSD). To fasten the expansion card, one end of the expansion card is inserted into a connector on a circuit board of a server. Then, the other end of the expansion card is fastened by screws, so that the expansion card can be fixed to the circuit board.

The expansion cards are usually installed in a single-layered manner on the circuit board. The single-layered expansion card is fastened by screws to the circuit board to prevent shifting of the expansion card to cause poor electrical connection or poor data transmission. A server needs to store a huge amount of data, and many expansion cards are used for data transmission and communication. However, if the expansion cards are disposed in a single-layered manner, they will take up too much space on the circuit board. In solution, the present invention provides a simple structure to stack the expansion cards vertically.

In view of this, the inventor studied various technologies and created an effective solution in the present disclosure.

SUMMARY

It is an objective of the present invention to provide a fastening device for stacking expansion cards, so as to fasten stacked expansion cards.

Accordingly, the present invention provides a fastening device for stacking expansion cards. The fastening device includes a fastener, a clamping member and a connection band. The fastener includes a body. The body includes a top portion and a bottom portion opposite to each other, a fastening hole is formed on the top portion along an axial direction of the body, and a plurality of claws are extended from the bottom portion. The clamping member includes a clamping base, a pin, a resilient element, and a push plate driven by the resilient element to move on the clamping base. One end of the pin protrudes from the clamping base to be inserted into the fastening hole. The connection band is bendable, one end of the connection band is connected to the fastener, and the other end of the connection band is connected to the clamping member. By this configuration, the fastening device can fasten stacked expansion cards to a circuit board.

Compared to conventional techniques, the fastening device has the following features. The body of the fastener includes the fastening hole and the claws. The clamping member includes the clamping base, the pin, the resilient element, and the push plate driven by the resilient element to move on the clamping base. When the pin of the clamping member is inserted in the fastener, the clamping base of the clamping member presses on the expansion card and the fastener, thereby positioning one end of the expansion card away from a connector. An accommodating recess for insertion of one end of the expansion card is formed at one end of the clamping base. One end of the clamping member presses on the expansion card to position one end of the expansion card. By this way, the fastening device can fasten stacked expansion cards, thus improving practicability.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present disclosure are illustrated below in conjunction with the accompanying drawings. However, it is to be understood that the descriptions and the accompanying drawings disclosed herein are merely illustrative and exemplary and not intended to limit the scope of the present disclosure.

Figure 1:
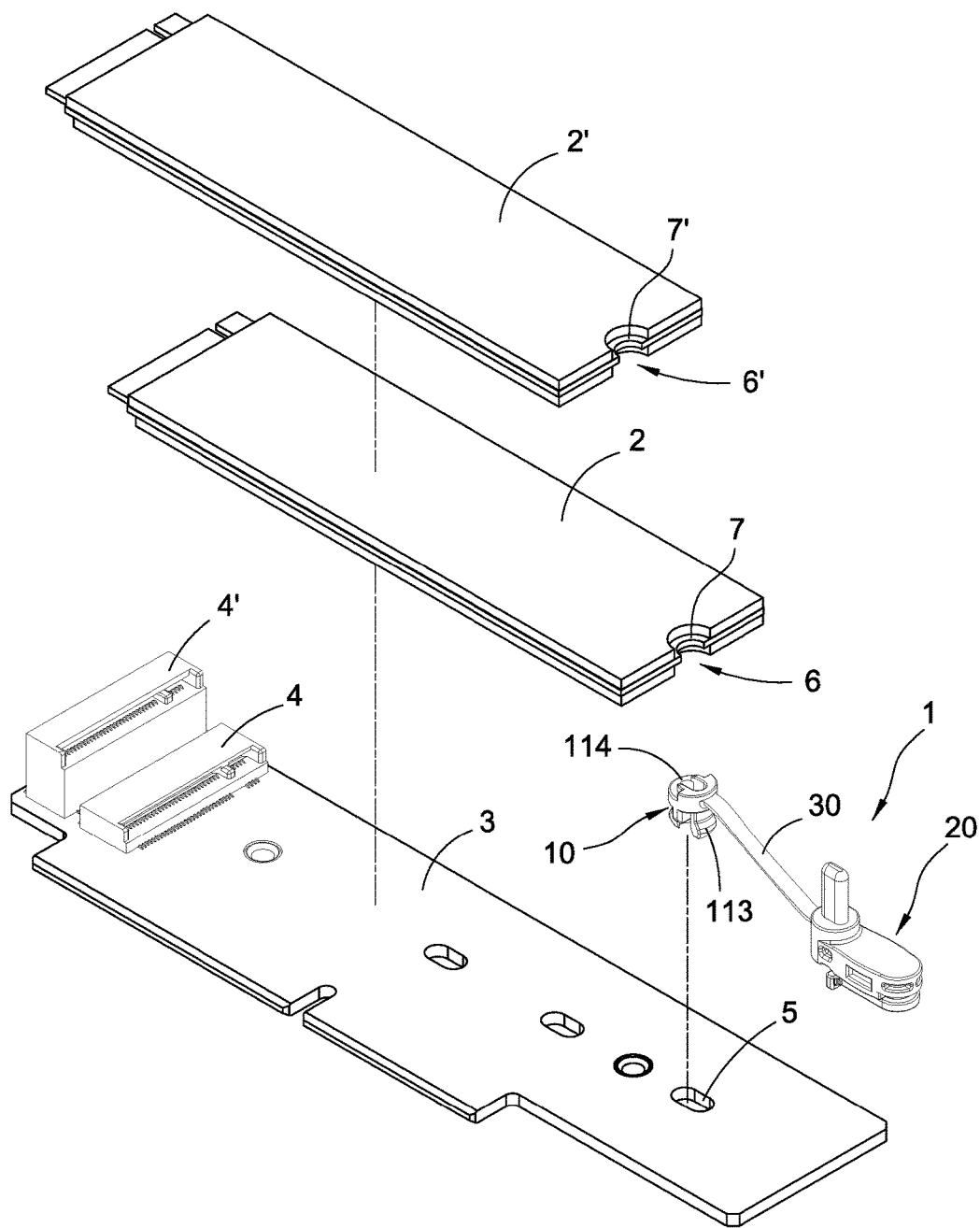
FIG. 1 is a schematic view illustrating a fastening device for stacking expansion cards according to the present invention.

Referring to FIG. 1, the present invention provides a fastening device 1 for stacking expansion cards 2. The fastening device 1 is used to fasten at least one expansion card 2 to a circuit board 3. A connector 4 is disposed on the circuit board 3. One end of the expansion card 2 is inserted into the connector 4, and the other end of the expansion card 2 is fastened to the circuit board 3 by means of the fastening device 1. In one embodiment of the present invention, two connectors 4, 4' are disposed in a staggered manner on the circuit board 3. Two expansion cards 2, 2' are inserted into the two connectors 4, 4', respectively, and are positioned on the circuit board 3 by the fastening device 1. A detailed description of the fastening device 1 is provided as follows.

Figure 2:
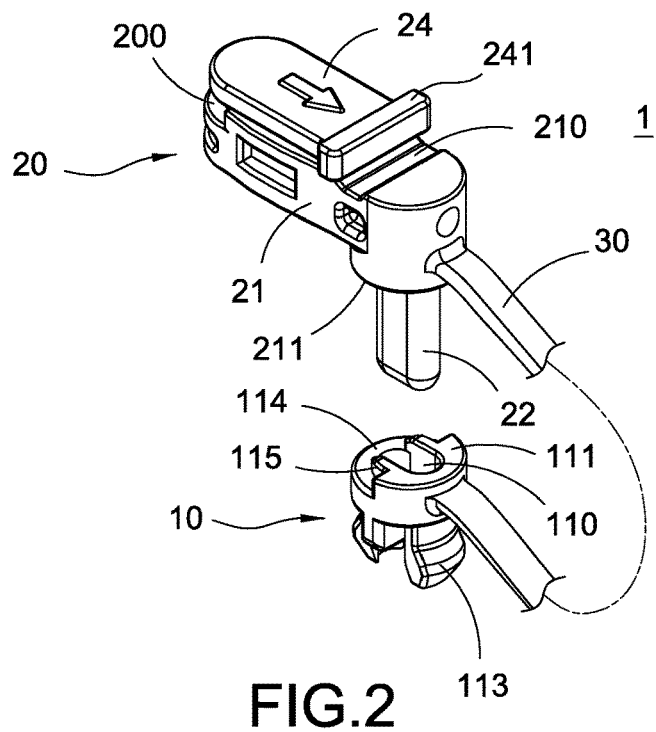
FIG. 2 is a perspective view illustrating the fastening device.
Figure 3:
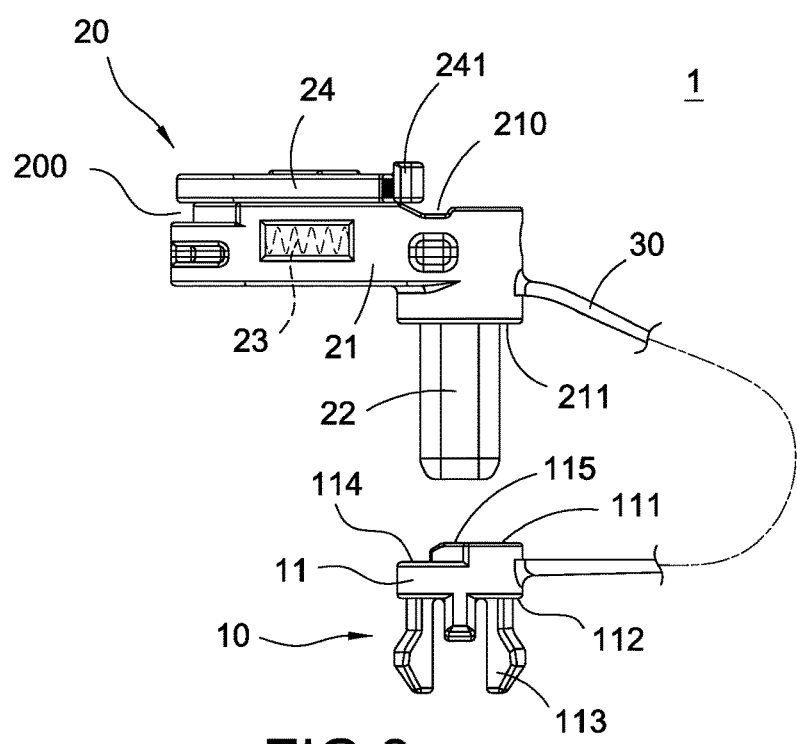
FIG. 3 is a side view illustrating the fastening device.

Please refer to FIGS. 2 and 3 for a perspective view and a side view of the fastening device 1. The fastening device 1 includes a fastener 10, a clamping member 20 and a connection band 30. The fastener 10 and the clamping member 20 are connected by means of the connection band 30. Two ends of the connection band 30 are connected to the fastener 10 and the clamping member 20, respectively.

The fastener 10 includes a body 11, the body 11 includes a top portion 111 and a bottom portion 112, a fastening hole 110 is formed on the top portion 111 along an axial direction, and a plurality of claws 113 are extended from the bottom portion 112. The claw 113 is preferably an elastic arm.

The clamping member 20 includes a clamping base 21, a pin 22 connected to the clamping base 21, a resilient element 23 in the clamping base 21, and a push plate 24 driven by the resilient element 23 to move on the clamping base 21. One end of the pin 22, protruding from the clamping base 21, is inserted into the fastening hole 110.

The resilient element 23 is preferably a spring. The push plate 24 includes a push rib 241 at one side, and a top surface of the push rib 241 protrudes from a top surface of the push plate 24. The push rib 241 facilitates gripping by a user to pull the push plate 24. Preferably, the clamping base 21 includes a reservation space 210 adjacent to the push rib 241. The reservation space 210 is provided so that the push plate 24 can move on the clamping base 21.

The connection band 30 is a bendable band. One end of the connection band 30 is connected to the fastener 10, and the other end of the connection band 30 is connected to the clamping member 20. The fastening device is constructed as mentioned above. The fastening device is in an integral form.

Figure 4:
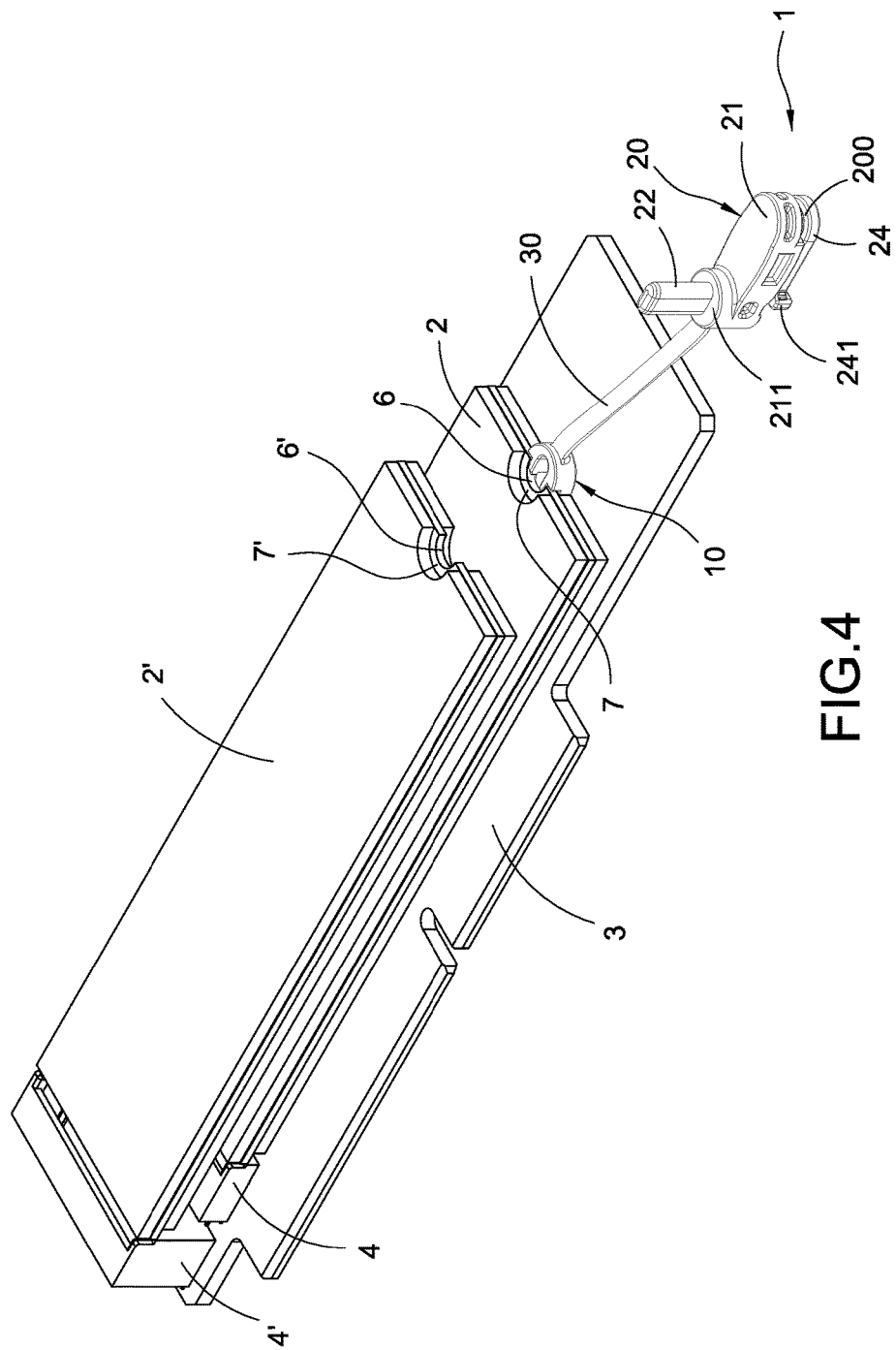
FIG. 4 is a schematic in-use view illustrating the fastening device used for fastening stacked expansion cards.
Figure 5:
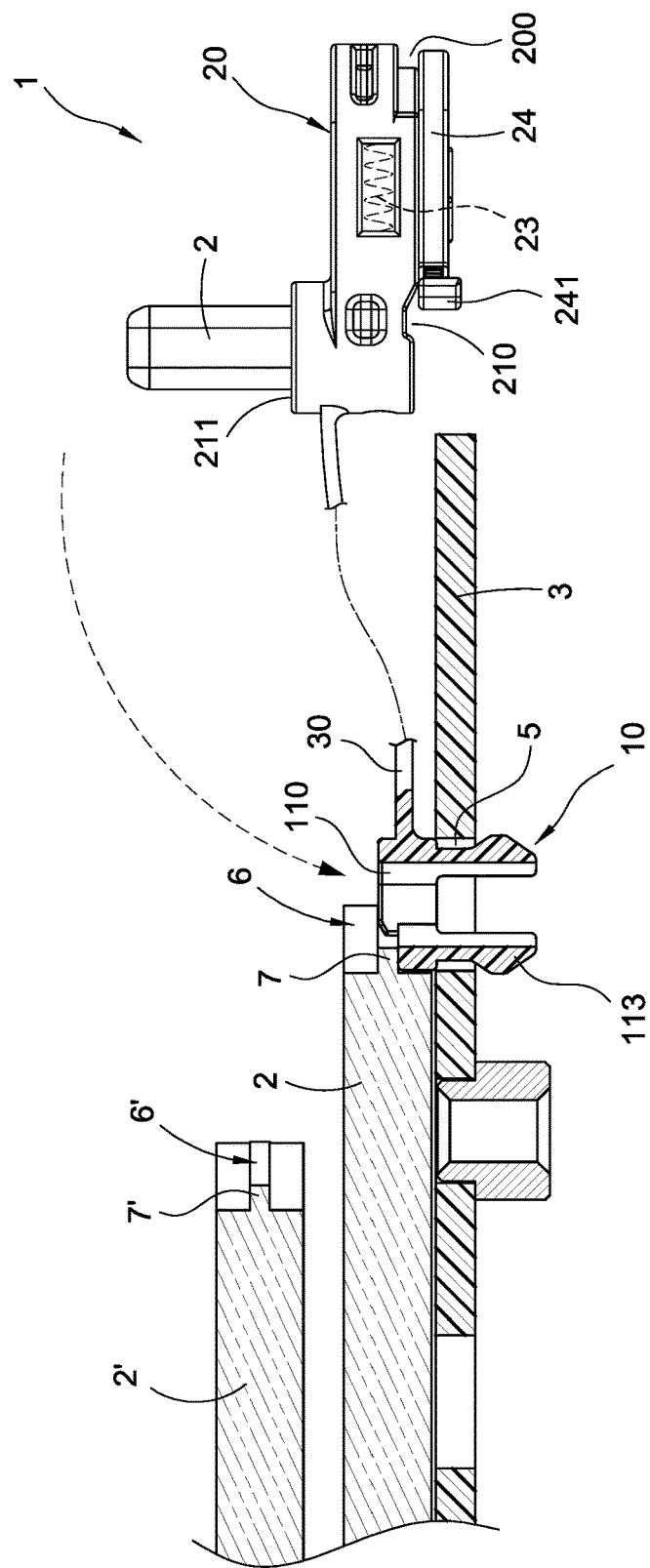
FIG. 5 is a schematic view illustrating how to use the fastening device to fasten stacked expansion cards.

Please refer to FIGS. 4 and 5 illustrating the fastening device 1 in use and how to use it. In the present embodiment, the circuit board 3 includes at least one positioning hole 5 (also see FIG. 1). The fastener 10 is coupled to the circuit board 3 by inserting the claws 113 into the positioning hole 5. A retaining recess 6 is formed at one side of the expansion card 2, and the body 11 is shaped to match contours of the retaining recess 6 so as to be partially received in the retaining recess 6.

In detail, a pressing board 7 is formed in the retaining recess 6 of the expansion card 2, the body 11 of the fastener 10 includes a platform 114 at one side of the fastening hole 110, and the pressing board 7 presses on the platform 114 in a manner such that a top surface of the pressing board 7 is flush with the top portion of the body 11. It is preferable that the body 11 includes two blocking arms 115 at two sides of the platform 114 in order to position the pin 22.

When the clamping member 20 is moved toward the fastener 10 by bending the connection band 30, the pin 22 is inserted in the fastening hole 110 of the fastener 10. When the pin 22 is inserted in the fastening hole 110, the two blocking arms 115 are in contact with the pin 22 at two sides thereof, so that the clamping member 20 is stably inserted in the fastener 10.

It should be noted that, the clamping base 21 of the clamping member 20 includes a pressing surface 211 for pressing on the top surface of the pressing board 7 and the top portion of the body 11, the pressing surface 211 is disposed at a bottom level of the pin 22. Therefore, when the pin 22 is inserted in the fastening hole 110, the pressing surface 211 presses on the top surface of the pressing board 7 and the top portion of the body 11, and thereby one end of the expansion card 2 away from the connector 4 is positioned.

Figure 6:
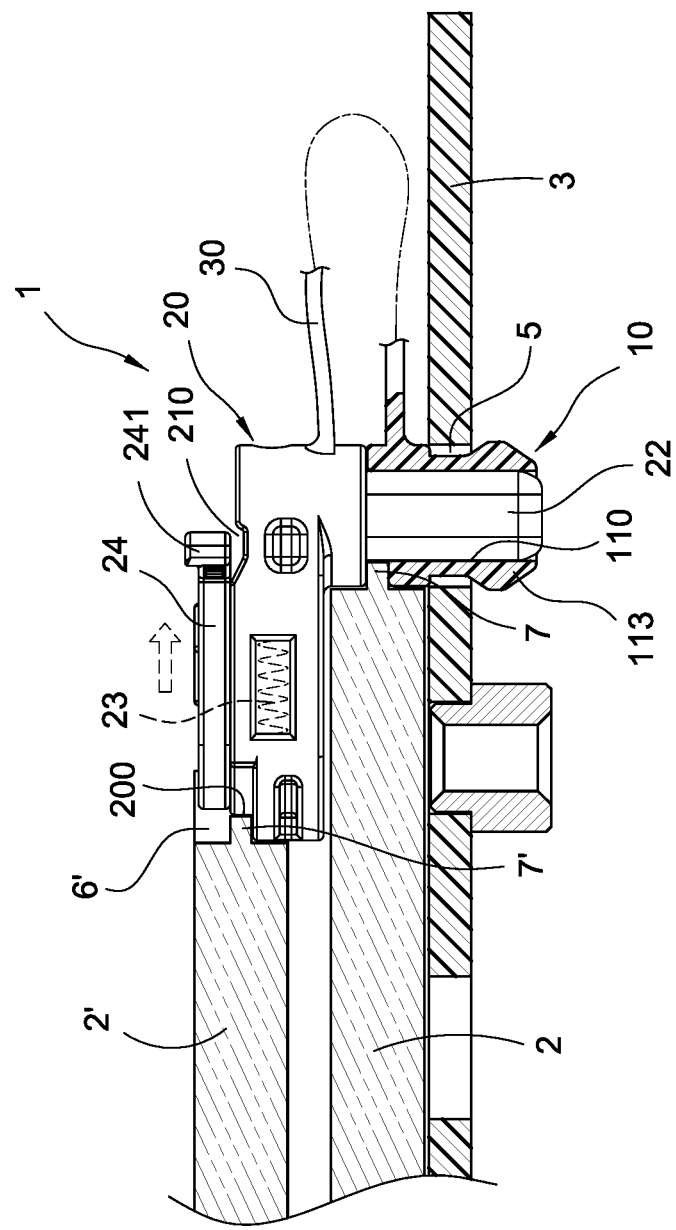
FIG. 6 is a schematic view illustrating applying a force to the fastening device.
Figure 7:
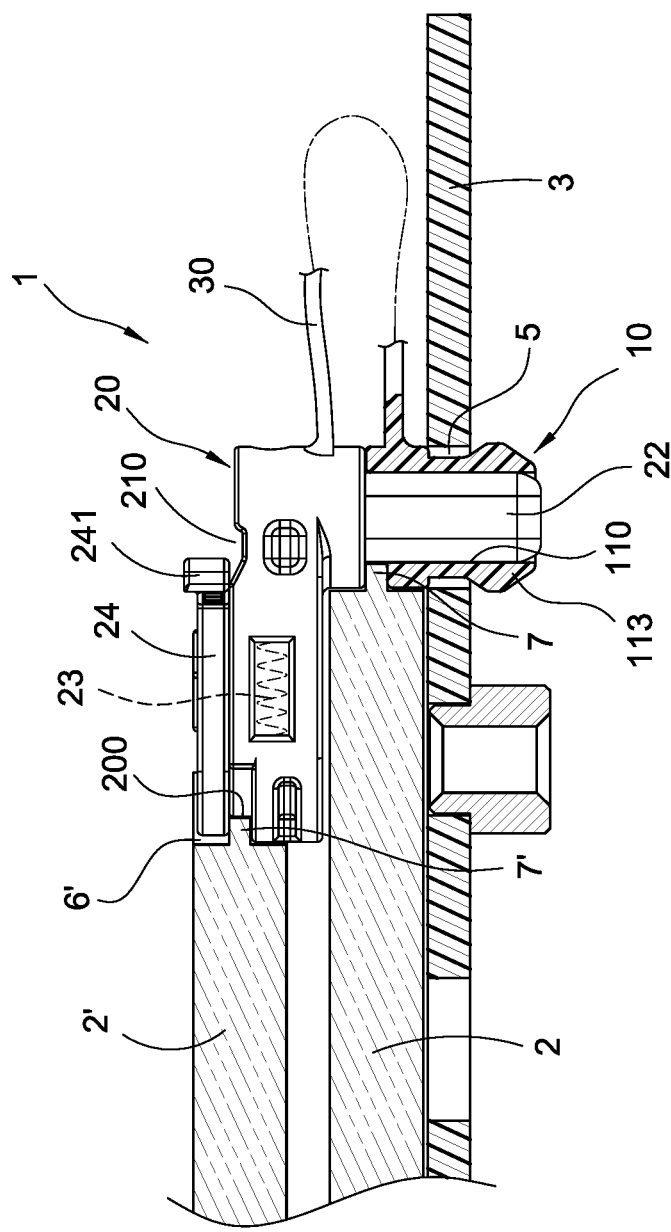
FIG. 7 is a cross-sectional view illustrating the fastening device after assembled.

Please refer to FIG. 6 illustrating applying a force to the fastening device 1 and also refer to FIG. 7 for a cross-sectional view of the fastening device after assembled. In the present embodiment, a second connector 4' for insertion of a second expansion card 2' is disposed on the circuit board 3. A retaining recess 6' is formed at one side of the expansion card 2', and a second pressing board 7' is disposed in the retaining recess 6'.

An accommodating recess 200 is formed at one end of the clamping base 21 of the clamping member 20. The second pressing board 7' is inserted in the accommodating recess 200.

To fasten the other expansion card 2' by the fastening device 1, a force is applied to the push rib 241 of the push plate 24 to push the push plate 24 in a direction away from the accommodating recess 200 to expose the accommodating recess 200, so that the second pressing board 7' of the second expansion card 2' can be inserted in the accommodating recess 200. When no external force is applied to the push plate 241, the push plate 24 is restored to its original position by the elasticity of the resilient element, and one end of the push plate 24 presses on the second pressing board 7' to position one end of the second expansion card 2'. One end of the second expansion card 2' is inserted in the second connector 4', and the other end of the second expansion card 2' is fastened by means of the fastening device 1.

To remove the second expansion card 2', a force applied to the push rib 241 to pull the push plate 24, so that the push plate 24 is moved toward the reservation space 210 to be removed from the second pressing board 7', thereby releasing the second expansion card 2'. Then, the second expansion card 2' without being pressed by the push plate 24 can be detached from the second connector 4'. By using the fastening device 1, the two expansion cards 2, 2' can be inserted into the two connectors 4 and fastened to the circuit board 3 in a convenient and easy way.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A fastening device for stacking expansion cards, for fastening at least one expansion card to a circuit board, at least one connector being disposed on the circuit board, one end of the expansion card being inserted into the connector, the fastening device comprising:
    a fastener including a body, the body including a top portion and a bottom portion opposite to each other, a fastening hole being formed on the top portion along an axial direction of the body, a plurality of claws being extended from the bottom portion;
    a clamping member, the clamping member including a clamping base, a pin connected to the clamping base, a resilient element in the clamping base, and a push plate driven by the resilient element to move on the clamping base, one end of the pin protruding from the clamping base to be inserted into the fastening hole; and
    a connection band, the connection band being bendable, one end of the connection band being connected to the fastener, the other end of the connection band being connected to the clamping member.

2. The fastening device for stacking the expansion cards according to claim 1, wherein a retaining recess is formed at one side of the expansion card, and the body is shaped to match contours of the retaining recess so as to be partially received in the retaining recess.

3. The fastening device for stacking the expansion cards according to claim 2, wherein a pressing board is formed in the retaining recess of the expansion card, the body includes a platform at one side of the fastening hole, and the pressing board presses on the platform in a manner such that a top surface of the pressing board is flush with the top portion of the body.

4. The fastening device for stacking the expansion cards according to claim 3, wherein the clamping base includes a pressing surface for pressing on a top surface of the pressing board and the top portion of the body, and the pressing surface is disposed at a bottom level of the pin.

5. The fastening device for stacking the expansion cards according to claim 3, wherein the body includes two blocking arms at two sides of the platform.

6. The fastening device for stacking the expansion cards according to claim 1, wherein the circuit board includes at least one positioning hole, and the fastener is coupled to the circuit board by inserting the claws into the positioning hole.

7. The fastening device for stacking the expansion cards according to claim 1, wherein the push plate includes a push rib at one side, and a top surface of the push rib protrudes from a top surface of the push plate.

8. The fastening device for stacking the expansion cards according to claim 7, wherein the clamping base includes a reservation space adjacent to the push rib.

9. The fastening device for stacking the expansion cards according to claim 1, wherein the resilient element is a spring.

10. The fastening device for stacking the expansion cards according to claim 1, wherein a second connector for insertion of the second expansion card is disposed on the circuit board, a second retaining recess is formed at one side of the second expansion card, a second pressing board is disposed in the second retaining recess, and an accommodating recess is formed at one end of the clamping base; when the push plate is pushed to move in a direction away from the accommodating recess to expose the accommodating recess, the second pressing board is allowed to be inserted in the accommodating recess; when no external force is applied to the push plate, the push plate is restored to its original position by the elasticity of the resilient element and presses on the second pressing board.

* * * * *